United States Patent
Gipson et al.

(10) Patent No.: US 10,952,323 B2
(45) Date of Patent: Mar. 16, 2021

(54) CABLE ASSEMBLY FOR IN-MOLDED ELECTRONICS ASSEMBLY

(71) Applicant: Dura Operating, LLC, Auburn Hills, MI (US)

(72) Inventors: Ron G. Gipson, Metamora, MI (US); Bhanumurthy Veeragandham, Auburn Hills, MI (US); Indraneel Page, Farmington Hills, MI (US)

(73) Assignee: DUS OPERATING INC., Auburn Hills, MI (US)

( * ) Notice: Subject to any disclaimer, the term of this patent is extended or adjusted under 35 U.S.C. 154(b) by 21 days.

(21) Appl. No.: 16/455,074

(22) Filed: Jun. 27, 2019

(65) Prior Publication Data

US 2020/0413538 A1   Dec. 31, 2020

(51) Int. Cl.
| | |
|---|---|
| *H05K 1/14* | (2006.01) |
| *H05K 1/18* | (2006.01) |
| *H05K 3/36* | (2006.01) |
| *F21V 7/00* | (2006.01) |
| *F21V 7/04* | (2006.01) |
| *G02F 1/133* | (2006.01) |
| *G02F 1/1333* | (2006.01) |
| *G02F 1/1335* | (2006.01) |
| *H05K 1/02* | (2006.01) |
| *H05K 7/14* | (2006.01) |
| *H05K 3/28* | (2006.01) |
| *B62D 25/04* | (2006.01) |
| *H05K 3/34* | (2006.01) |
| *F21Y 115/10* | (2016.01) |

(52) U.S. Cl.
CPC .............. *H05K 1/14* (2013.01); *B62D 25/04* (2013.01); *F21V 7/0066* (2013.01); *H05K 1/0277* (2013.01); *H05K 1/181* (2013.01); *H05K 3/284* (2013.01); *H05K 3/341* (2013.01); *H05K 3/36* (2013.01); *H05K 7/1427* (2013.01); *F21Y 2115/10* (2016.08); *H05K 2201/10113* (2013.01); *H05K 2201/10356* (2013.01)

(58) Field of Classification Search
CPC ............ H05K 1/14; H05K 1/18; H05K 1/181; H05K 3/36; H05K 3/284; H05K 3/341; F21V 7/00; F21V 7/04; G02F 1/133; G02F 1/1333; G02F 1/1335
USPC ...... 361/749; 362/373, 615, 616; 349/58, 65
See application file for complete search history.

(56) References Cited

U.S. PATENT DOCUMENTS

| | | | |
|---|---|---|---|
| 10,701,480 B1 * | 6/2020 | Yang ........................ | G02C 5/18 |
| 2003/0026086 A1 * | 2/2003 | Kawashima ......... | G02B 6/0086 |
| | | | 362/610 |
| 2003/0086358 A1 * | 5/2003 | Park ..................... | G11B 17/056 |
| | | | 369/248 |

(Continued)

*Primary Examiner* — Xiaoliang Chen
(74) *Attorney, Agent, or Firm* — Vivacqua Crane (57) ABSTRACT

An electronic assembly and a method of forming an electronic assembly. The electronic assembly including a printed circuit board including a first face, a flexible printed circuit connected to the first face of the printed circuit board, a filler component arranged over a first portion of the first face of the printed circuit board, a housing defining a cavity, wherein the filler component is arranged in the cavity, a channel guide extending from the housing, wherein the flexible printed circuit sits in the channel guide, and a substrate positioned adjacent to a second face of the printed circuit board, wherein the second face opposes the first face.

17 Claims, 6 Drawing Sheets

(56) References Cited

U.S. PATENT DOCUMENTS

| | | | | |
|---|---|---|---|---|
| 2007/0153548 A1* | 7/2007 | Hamada | ............... | G02B 6/0036 |
| | | | | 362/615 |
| 2011/0143825 A1* | 6/2011 | Ahn | ..................... | H04M 1/026 |
| | | | | 455/575.4 |
| 2014/0142507 A1* | 5/2014 | Armes | ................... | A61M 5/20 |
| | | | | 604/112 |
| 2014/0375899 A1* | 12/2014 | Ozeki | ................... | G02B 6/009 |
| | | | | 348/791 |
| 2015/0321474 A1* | 11/2015 | Ichizono | ................. | B41J 2/155 |
| | | | | 347/54 |
| 2018/0083322 A1* | 3/2018 | Pakula | ................... | H05K 1/144 |
| 2018/0300523 A1* | 10/2018 | Fang | .................. | G02F 1/13338 |

\* cited by examiner

CABLE ASSEMBLY FOR IN-MOLDED ELECTRONICS ASSEMBLY

FIELD

The present disclosure is directed to a cable assembly for an in-molded electronics assembly.

BRIEF DESCRIPTION

The statements in this section merely provide background information related to the present disclosure and may or may not constitute prior art.

Electronic assemblies may include a number of electrical components, such as printed circuit boards and electrical components mounted to or associated with the printed circuit boards, such as capacitors, chipsets and light emitting diodes. In addition, printed circuit boards, and the associated electrical components, may be encapsulated or mounted in a polymer material to provide a housing, protection for the circuit board or to act as a light guide for light emitting sources associated with the printed circuit board. Further, these electronic assemblies may become a part of larger assemblies. For example, the electronic assemblies may be mounted vehicle trim components, through processes, such as in-mold assembly, that use thermal or mechanical energy. Power and data is communicated between the assemblies and other devices, such as control systems and motors, through the use of one or more wires coupled to the printed circuit board. Where more than one wire is present, the wires may be carried by a wire harness.

Connections between wires and the printed circuit board may be made through mechanical connections. However, mechanical connections may be weak, creating a failure point between the wires and the printed circuit board. Further, it is difficult to over-mold without resin flowing between the wires or between the wires and the printed circuit board, which may interrupt the electrical connections. In addition, the connectors needed to affix wires to the printed circuit board add bulk to the electronic assembly, which often must fight in rather tight locations.

Thus, while current electronic assemblies achieve their intended purpose, there is a need for a new and improved system and method for coupling wires to electronic assemblies.

SUMMARY

According to several aspects, an electronic assembly includes a printed circuit board including a first face and a flexible printed circuit connected to the first face of the printed circuit board. The electronic assembly further includes a filler component arranged over a first portion of the first face of the printed circuit board and a housing defining a cavity, wherein the filler component is arranged in the cavity. In addition, a channel guide extends from the housing, wherein the flexible printed circuit sits in the channel guide. The electronic assembly yet further includes a substrate positioned adjacent to a second face of the printed circuit board, wherein the second face opposes the first face.

In additional aspects, the first face of the printed circuit board includes a plurality of electrical components and the filler component encapsulates at least a portion of the electrical components.

In additional aspects, the printed circuit board includes a plurality of contacts and the flexible printed circuit is soldered to at least a portion of the plurality of contacts.

In additional aspects, the flexible printed circuit defines a proximal end and the proximal end is connected to the printed circuit board and the filler component encapsulates the proximal end.

In additional aspects, the second portion of the printed circuit board includes a plurality of openings and a light emitter associated with each of the plurality of openings.

In further aspects, the housing defines an exterior opposing the cavity and a reflector is mounted to the exterior of the housing covering the second portion of the printed circuit board.

In additional aspects, the flexible printed circuit includes a distal end and the electronic assembly further comprises a plurality of wires in contact with the distal end of the flexible printed circuit.

In further aspects, the plurality of wires are mechanically retained against the flexible printed circuit.

In further aspects, the electronic assembly includes a protective covering encasing the distal end of the flexible printed circuit and the plurality of wires.

In additional aspects, the protective covering is formed from a low pressure molding resin and sits in the channel guide.

In additional aspects, the filler component is formed from a low-pressure molding resin.

In additional aspects, the substrate is connected to the second face of the printed circuit board.

In additional aspects, the substrate is connected to the housing.

According to several aspects, a trim panel assembly includes a support panel, the support panel includes an exterior surface and a cavity defined in the exterior surface. The trim panel assembly further includes an electronic assembly located in the cavity, and a skin layer connected to the support panel. The electronic assembly is positioned between the support panel and the skin layer and the substrate is adjacent to the skin layer. The electronic assembly includes a printed circuit board including a first face and a second face, a flexible printed circuit coupled to the first face of the printed circuit board, a filler component arranged over a first portion of the first face of the printed circuit board, a housing including a cavity, wherein the filler component is arranged in the cavity, a channel guide extending from the housing, wherein the flexible printed circuit sits in the channel guide, and a substrate positioned adjacent to the second face of the printed circuit board.

In additional aspects, the flexible printed circuit includes a distal end and the electronic assembly further comprises a plurality of wires connected to the distal end of the flexible printed circuit at a connection.

In additional aspects, the trim panel assembly further includes a protective covering encasing the connection between the flexible printed circuit and the plurality of wires, wherein the protective covering is at least partially received in the channel guide.

In additional aspects, the protective covering is formed from a low-pressure molding resin.

According to several aspects, a method of forming an electronic assembly includes positioning a substrate adjacent to a second face of a printed circuit board, soldering a proximal end of a flexible printed circuit to a first face of a printed circuit board, molding a filler component onto a first portion of the first face of the printed circuit board, arranging a housing over the filler component and printed circuit board, and arranging the flexible printed circuit in a channel guide extending from the housing.

In further aspects, the method includes connecting a distal end of the flexible printed circuit to a proximal end of a plurality of wires.

In further aspects, the method includes forming a protective covering over the distal end of the flexible printed circuit and the proximal end of the plurality of wires.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application or uses.

The terms "exterior" and "interior" are terms used relative to the orientation of a vehicle 10 as shown in the drawings of the present application. Thus, "exterior" refers to the external portion of the vehicle and "interior" refers to the compartments within the body of the vehicle 10. The terms "first face", "second face", "lateral" and "longitudinal" are terms relative to the orientation of the printed circuit board as shown in the drawings of the present application. Thus, while the orientation of the printed circuit board as shown in the drawings may change with respect to a given use, these terms are intended to still apply relative to the orientation of the printed circuit board as shown in the drawings.

Figure 1:
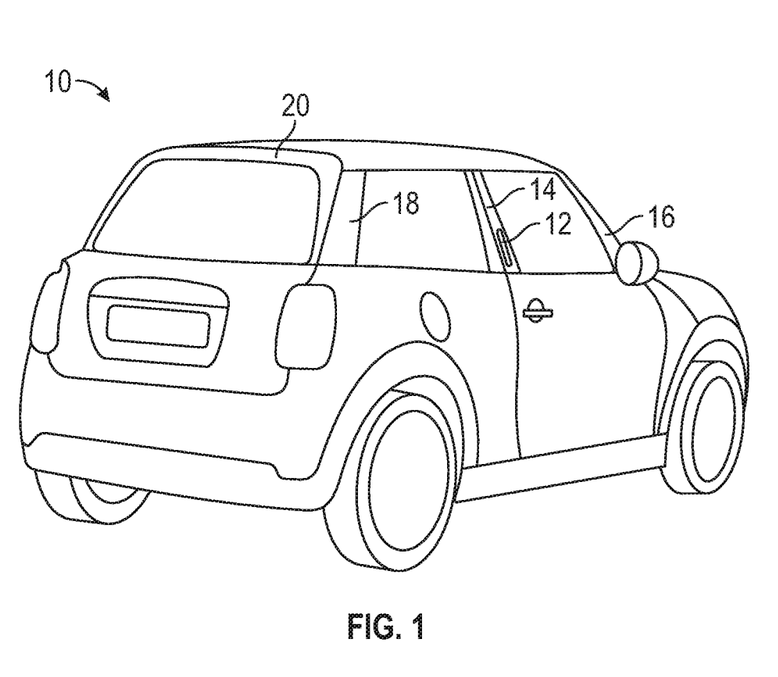
FIG. 1 is an illustration of a vehicle including a trim panel according to an exemplary embodiment.

Electronic assemblies may be used as operator interfaces on vehicles. Such interfaces may be interactive, where a human can interact with the vehicle to, for example, unlock or lock vehicle doors, open a trunk or hatch, determine the level of battery charge or amount of fuel available, determine vehicle alarm status, etc. FIG. 1 illustrates an example of a vehicle 10 including an electronic assembly 12 integrated into a trim panel assembly 22 (see FIG. 2) that provides the B-pillar trim panel 14. As illustrated, the vehicle is an automobile; however, it may be appreciated that electronic assemblies may be integrated into other vehicles, such as but not limited to personal and commercial trucks, motorcycles, aviation vehicles including helicopters and airplanes, and watercraft including boats and personal watercraft. Further, while FIG. 1 illustrates the electronic assembly 12 integrated into the B-pillar trim panel 14, electronic assemblies 12 may be integrated into other exterior trim components, such as the A-pillar trim panel 16, C-pillar trim panel 18, or spoiler trim panel 20 as well as interior trim components.

Figure 2:
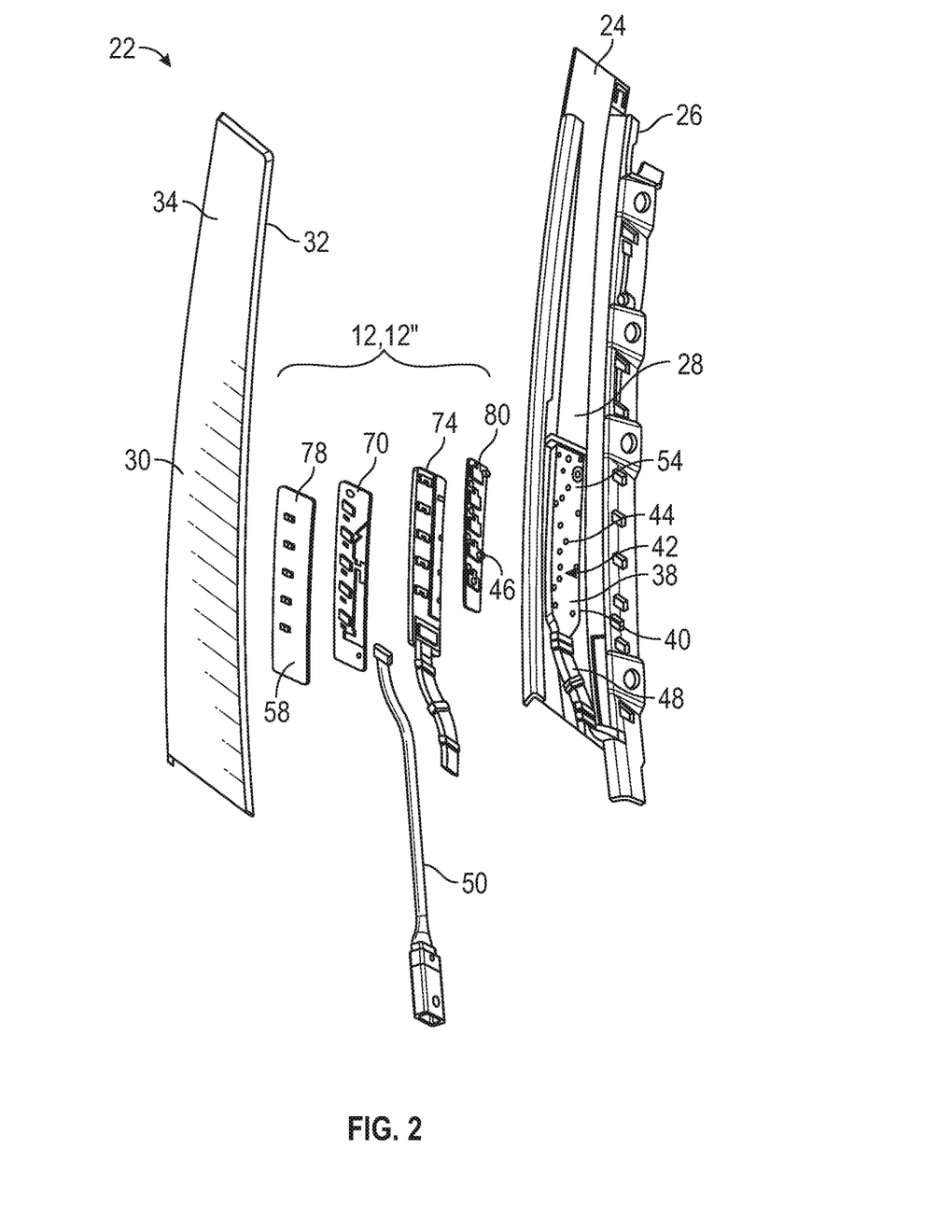
FIG. 2 is an illustration of a trim panel assembly according to an exemplary embodiment.

An exploded view of a trim panel assembly 22 providing the B-pillar trim panel 14 is illustrated in FIG. 2. The trim panel assembly 22 is illustrated as being curvate and oblong; however, it may be appreciated that the trim panel assembly 22 may assume any number of geometries. The trim panel assembly 22 includes the electronic assembly 12 described further herein, a support panel 24, which includes an interior face 26 and an exterior surface 28, and a skin layer 30, which also includes an interior face 32 and an exterior surface 34.

The support panel 24 is formed from a polymer material and, in aspects, a thermoplastic polymer material such as acrylonitrile-butadiene-styrene (ABS), acrylonitrile styrene acrylate (ASA), polycarbonate, polyamide 6, polyethylene terephthalate, polybutylene terephthalate, co-polymers thereof, and blends thereof. In additional aspects, the support panel 24 is formed from an opaque material, which in further aspects may be understood as a material that transmits less than 5%, and as low as 0%, of incident electromagnetic waves in the visible range (380 nm to 800 nm) by, e.g., reflecting, absorbing, or scattering the incident electromagnetic waves. In various aspects, the support panel 24 provides structural support for the trim panel assembly 22.

As illustrated, the support panel 24 further defines a cavity 38 which includes an opening 40 at the exterior surface 28. The cavity 38 defines an interior volume 42 in which the electronic assembly 12 is located. In aspects, the electronic assembly 12 may be received in the cavity 38 and, in further aspects, the exterior surface 28 of the support panel 24 and the exposed portion of the electronic assembly 12 form a continuous surface at the exterior surface 28 of the support panel 24. In aspects, the exterior surface 28 of the support panel 24 and the electronic assembly 12 create a continuous surface without gaps therebetween.

The cavity 38 may include at least one receiving feature 44 that receives at least one locating feature 46 of the electronic assembly 12. It may be appreciated that a plurality of locating and receiving features 46, 44 may be provided, such as in the range of 1 to 10 of each feature. The receiving features 44 include, for example, blind holes, and the locating features 46 include, for example, bosses, which form an interference fit between them. Further, the support panel 24 defines a channel 48 that accommodates a flexible printed circuit 50, which in turn is coupled to a wires 52. The flexible printed circuit 50 and wires 52 may transmit power, data, or a combination thereof to and from the electronic assembly 12 to one or more controllers (not illustrated) located throughout the vehicle 10. Further, in aspects, the cavity 38 of the support panel 24 may conform to the portion of the electronic assembly 12 received in the cavity 38, wherein the surface 54 of the cavity 38 is adjoining, and in further aspects contiguous with, at least a portion of the exterior surface 56 of the electronic assembly 12.

The skin layer 30 is disposed over the support panel 24, wherein the interior face 32 of the skin layer 30 is disposed adjacent to the exterior surface 28 of the support panel 24. In aspects, the skin layer 30 is formed from translucent material, which may be understood as material that transmits more than 5% of incident electromagnetic waves in the visible range (380 nm to 800 nm), including all values and ranges from 5% to 100%, such as 50% to 99%, with or without (in the case of transparent material) diffusion of the light through the material. In additional or alternative aspects, the skin layer 30 is formed from poly(methyl methacrylate) (PMMA), polycarbonate (PC), polyurea, polyurethane, poly(ether ether ketone) (PEEK), polyetherimide, as well as blends thereof or co-polymers thereof. Further, in aspects, the skin layer 30 conforms to the support panel 24 and the portion 58 of the electronic assembly 12 exposed by the cavity 38, wherein the interior face 32 of the skin layer 30 is adjoining, and in further aspects contiguous with, at least a portion of, if not all of, the exterior surface 28 of the support panel 24 and the exposed portion 58 of the electronic assembly 12.

Figure 3:
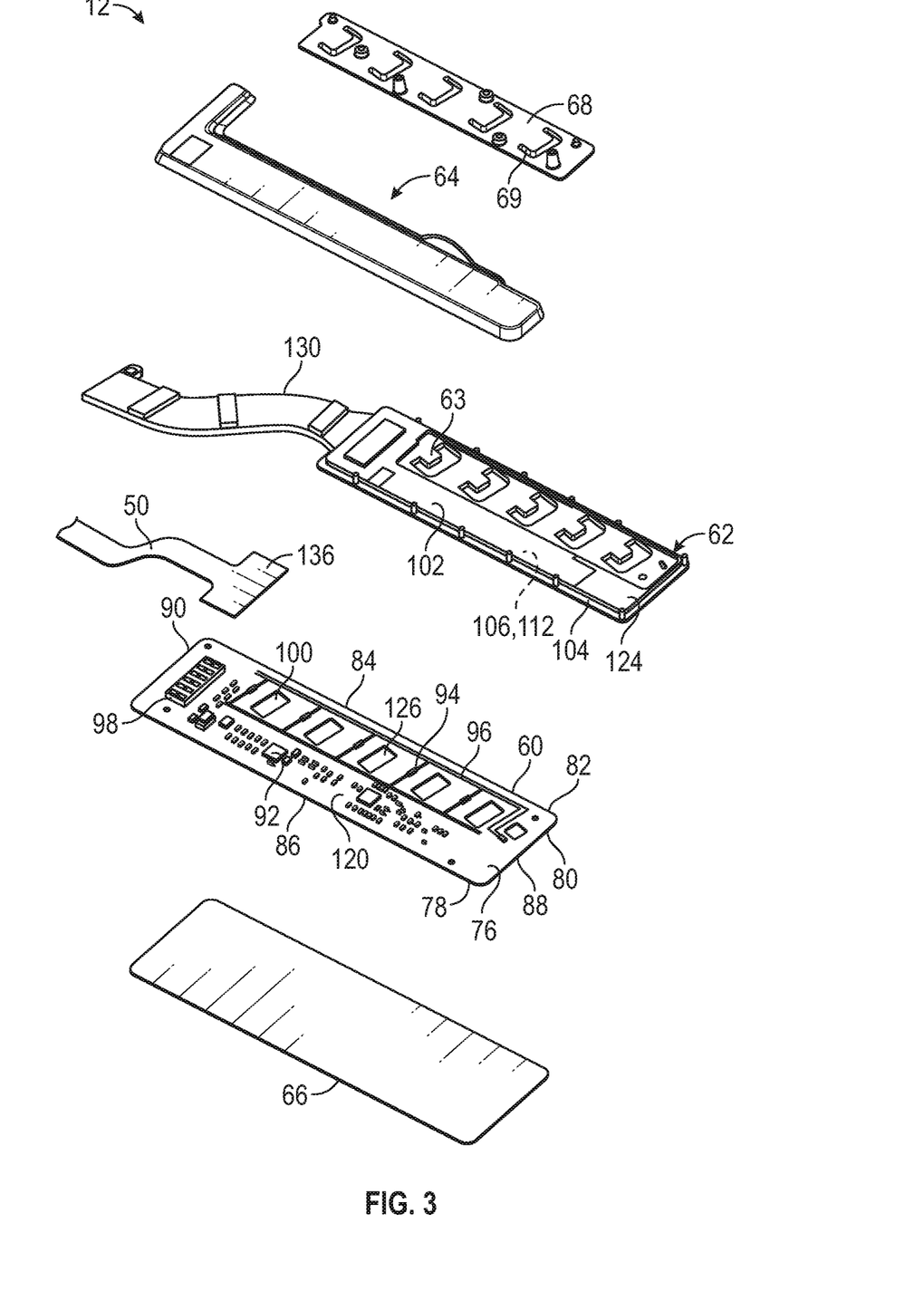
FIG. 3 is an exploded view of an electronic assembly according to an exemplary embodiment.

Reference is now made to FIG. 3, which illustrates an aspect of an electronic assembly 12, with further reference to FIG. 2. In aspects, the electronic assembly 12 includes a printed circuit board 60, a housing 62, and a filler component 64. Further, as illustrated in FIG. 2, a substrate 66 is provided, which is visible from the exterior surface 34 of the skin layer 30. A reflector 68 is also provided in the electronic assembly, which is illustrated as being positioned on the exterior 124 of the housing 62.

The printed circuit board 60 includes a first face 76, a second face 78, and a side wall 80 joining the first face 76 and the second face 78 at the perimeter 82 of the printed circuit board 60. In aspects, the faces 76, 78 of the printed circuit board 60 are oblong and rectangular shaped including opposing longitudinal sides 84, 86 and opposing lateral sides 88, 90. However, it may be appreciated that other configurations are contemplated, such as square, oval or circular. The printed circuit board 60 may be formed from, e.g., laminate materials including a fabric or paper encapsulated by a resin. The fabric maybe formed from a woven or non-woven material, such as glass fiber or one or more polymer fibers. The encapsulating resin may include, for example, phenolic formaldehyde, epoxy or polyester. Examples of printed circuit boards may include but are not limited to FR1, FR2, FR3, FR4, CEM-1, CEM-3, flex or rigid-flex.

The printed circuit board 60 further includes a number of electrical components 92 mounted thereon. The electrical components 92 include capacitors, resistors, memory chips, and processors, as well as light emitters 94, such as LED's, coupled together by a number of electrical traces 96 located on either face of, or within, the printed circuit board 60. Contacts 98 are also provided on the printed circuit board 60 to which the flexible printed circuit 50 is soldered. Solder is used to solder the flexible printed circuit 50 to the printed circuit board 60. In aspects, the solder, which may be solid or in the form of a soldering paste, has a melt temperature that is lower than the melt temperature of the materials used in the flexible printed circuit 50. The printed circuit board 60 also includes a number of openings 100 therein, through which the light, emitted by the light emitters 94 located on the first face 74 and reflected by reflector 68 shines through.

A housing 62 provides light guides 63 for the light emitters 94, such as an LED, that is associated with or connected to the printed circuit board 60. The housing 62 includes a first, primary wall 102 and a periphery, side wall 104 that extends from the primary wall 102. The primary wall 102 and side wall 104 form a cavity 106 (see FIG. 4D) defining an interior volume 112 therein. In aspects, the housing 62 exhibits a height in the range of 3.5 mm to 5.5 mm in thickness, including all values and ranges therein.

The housing 62 is formed from a translucent material, which may be understood as material that transmits more than 5% of incident electromagnetic waves in the visible range (380 nm to 800 nm), including all values and ranges from 5% to 100%, such as 50% to 99%, with or without (in the case of transparent material) some degree of diffusion of the light through the material. In additional or alternative aspects, the housing 62 is formed from poly(methyl methacrylate) (PMMA), polycarbonate (PC), polyurea, polyurethane, poly(ether ether ketone) (PEEK), polyetherimide, as well as blends thereof or co-polymers thereof. In aspects, the housing 62, and specifically the cavity 106, includes a ledge 114 (see FIG. 4D) which adjoins, and in further aspects is contiguous with, at least a portion of the first face 76 of the circuit board 60. In aspects, the ledge 114 is formed in in locations coincident with locations on the printed circuit board 60 that do not include components 92, such as near the lateral side 90 of the printed circuit board 60 where the flexible printed circuit 50 is attached to the printed circuit board 60. The ledge 114 spaces the electrical components 92 on the printed circuit board 60 from the upper surface 116 of the cavity 106 to prevent damage to the electrical components 92 through the remaining portion of the assembly process and during use.

A filler component 64 is formed on the printed circuit board 60 encapsulating a number of the electrical components 92 and sits between the first face 76 of the printed circuit board 60 and the cavity 106 of the housing 62. In aspects, the filler component 64 sits on a first portion 120 of the printed circuit board 60 between the openings 100 and the longitudinal edge 86 on the first face 76. Further, the filler component 64 extends over the flexible printed circuit 50 connection to the printed circuit board 60. In yet further aspects, illustrated in FIGS. 4A and 4D, the filler component 64 extends over the flexible printed circuit 50 connection to the printed circuit board 60 to the edge of the housing 62 near the first lateral end 90. And, in yet further aspects, the filler component 64 conforms to the interior volume 112 between the first face 76 and the upper surface 116 of the cavity 106. A filler component 64 may also be present between the second face 78 of the printed circuit board 60 and the substrate 66.

In further aspects, the filler component 64 is formed from a low pressure molding resin (i.e., a polymer material). The low pressure molding resin provides a relatively low coefficient of linear thermal expansion, such as in the range of 175 ppm/° C. to 220 ppm/° C. as tested according to ASTM D 696-98, including all values and ranges therein, such as 195 ppm/° C. In aspects, the low pressure molding resin exhibits a melt temperature in the range of 120° C. to 260° C., including all values and ranges therein, such as 230° C. to 240° C. The polymer material may further exhibit an injection pressure in the range of 0.1 to 20 MPa, including all values and ranges therein, such as 0.1 MPa to 3.5 MPa, at or above melt temperature and below degradation temperature. The low pressure molding resins may also exhibit a viscosity in the range of 240 centipoise to 375 centipoise including all values and ranges therein, wherein the viscosity is tested according to ASTM 3236 (RTV spindle 27). Example of low pressure molding resins include, but are not limited to polyamide, polyolefin and polyurethane rubber hot melt resin. It may be appreciated that the coefficient of linear thermal expansion may reduce pulling or shearing of the electrical components 92 off the printed circuit board 60 when exposed to elevated temperatures. It may further be appreciated that the filler component prevents the components from being crushed during further molding and assembly steps and prevents infiltration of other materials molded over the electronics assembly into the assembly housing.

Further the filler component may remove air cavities and prevent water and moisture accumulation within the electronic assembly.

Also provided is a reflector 68. In the aspect illustrated, the reflector 68 is a polymer sheet or film formed from, e.g., poly(methyl methacrylate) (PMMA), polycarbonate (PC), polyurea, polyurethane, poly(ether ether ketone) (PEEK), polyetherimide, as well as blends thereof or co-polymers thereof. In yet further aspects, the reflector 68 is white in color. In alternative aspects, the reflector 68 includes a silver or nickel metal or metal alloy. If a metal or metal alloy, the reflector 68 may include a sputtered coated on between a polymer substrate and an insulating polymer coating.

The reflector 68 is illustrated as being positioned on the exterior 124 of the housing 62 over a second portion 126 of the printed circuit board 60 extending between the filler component 64 and over the openings 100 to proximal to the second longitudinal edge 84. The reflector 68 reflects light emitted from the light emitters 94 through the openings 100 and towards the substrate 66 and, when assembled, the skin layer 30 of the trim assembly 22. The reflector 68 defines a plurality of horseshoe or "C" shaped walls 69 that isolates the light emitted by each light emitter 94 to the corresponding opening 100.

With reference again to FIGS. 2, 3, 4A and 4C, a channel guide 130 extends from the housing 62 and is formed integrally with the housing 62. However, the channel guide 130 may alternatively be formed as a separate component from the housing 62 and attached thereto with mechanical fasteners. The flexible printed circuit 50 sits within the channel guide 130. The channel guide 130 is sized and configured to accommodate the flexible printed circuit 50. As illustrated, the distal end 132 of the channel guide 130 extends past the distal end 134 flexible printed circuit 50.

Figure 4A:
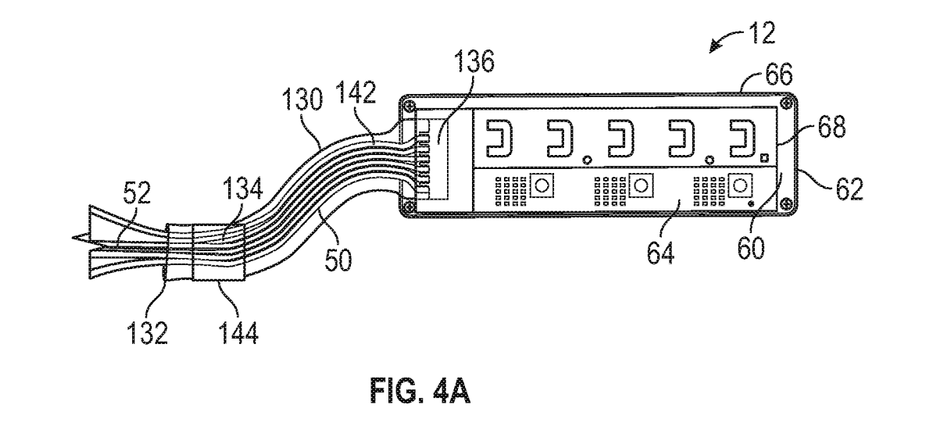
FIG. 4A is a top view of the electronic assembly according to an exemplary embodiment.
Figure 4B:
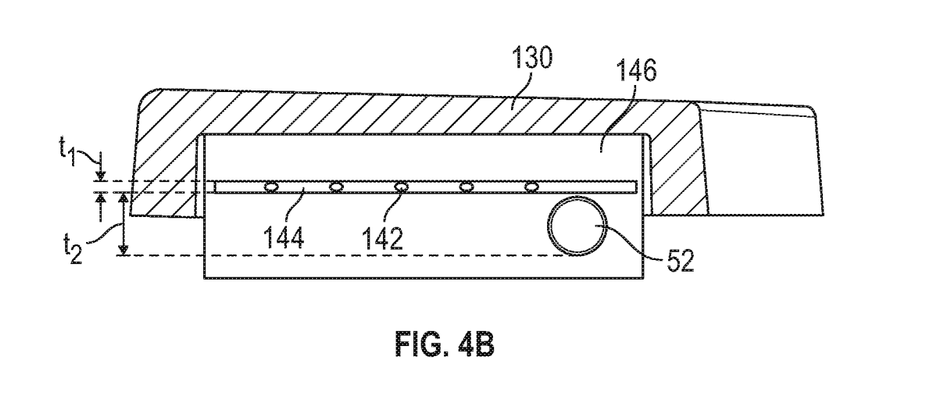
FIG. 4B is an illustration of a cross-section where the flexible printed circuit is affixed to the printed circuit board according to an exemplary embodiment.
Figure 4C:
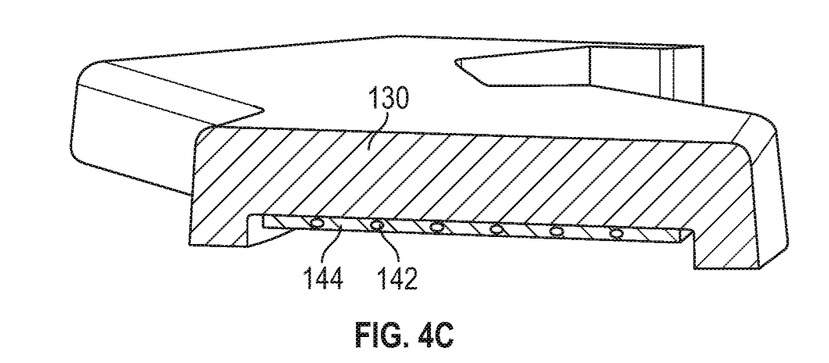
FIG. 4C is an illustration of a cross-section of the flexible printed circuit between the printed circuit board and the wire coupling according to an exemplary embodiment.
Figure 4D:
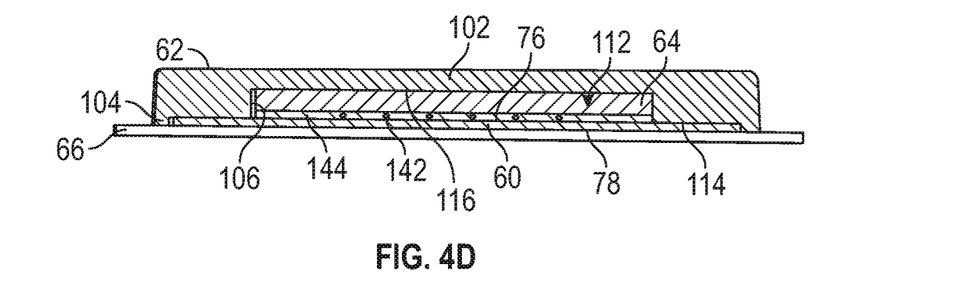
FIG. 4D is an illustration of a cross-section of the coupling between the flexible printed circuit and the wires according to an exemplary embodiment.

As illustrated the aspect presented in FIGS. 3, 4A and 4B, the flexible printed circuit 50 is coupled to the printed circuit board 60 at a proximal end 136 of the flexible printed circuit 50. The flexible printed circuit 50 may assume any overall configuration to accommodate the trim panel assembly 22 (see FIG. 2) and surrounding environment. As illustrated in FIGS. 4A and 4B, the flexible printed circuit 50 is coupled to wires 52 which may be carried by e.g., a wire harness (not illustrated), to electronic control units (not illustrated), motors, sensors or other hardware in the vehicle bringing power and data signals to and from the other components to printed circuit board 60. It is understood that the flexible printed circuit 50 includes one or more electrically conductive traces 142 disposed on, often by a printing process, a flexible carrier 144, such as a polymeric film. It may further be appreciated that the conductive traces 142 are flat having a first thickness t1 that is less than a second thickness t2 of the round wires 52 (see FIG. 4B). At the proximal end 136 and distal end 134 contacts may be provided to assist in soldering the flexible printed circuit 50 to the printed circuit board 60 or wires 52.

Figure 5:
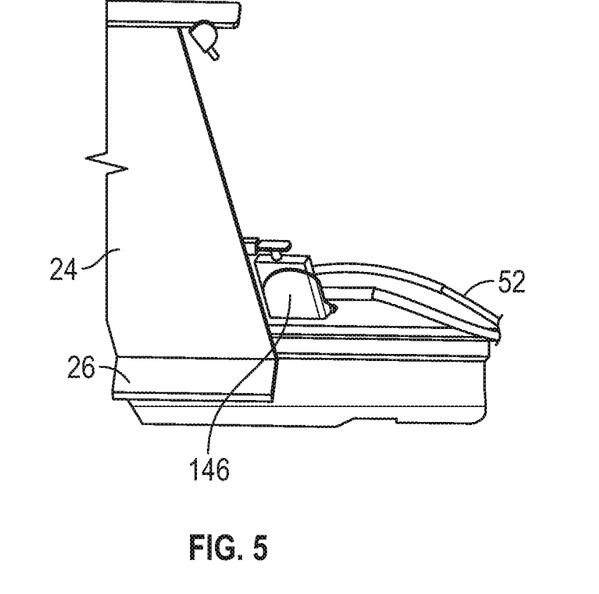
FIG. 5 illustrates the mold shutoff edge for the mold used in forming low pressure molding resin around the wire.

As illustrated in FIG. 4B a protective covering 146 encases the connection between the flexible printed circuit 50 and the wires 52. In aspects, the protective covering 146 is formed of low-pressure molding resin, including the characteristics and materials of the low-pressure molding resins noted above. The protective covering 146 assists in securing the flexible printed circuit 50 and wires 140 together and provides electrical insulation as well as abrasion and environmental protection to the connection between the flexible printed circuit 50 and wires 140. Further, in aspects, the base 148 of the protective covering 146 aligns with the base 150 of the primary wall 152 of the support panel 24. As illustrated in FIG. 5, the protective covering 146 then provides a mold shut-off point for situations in which the support panel 24 is injection molded onto the electronic assembly 12, this prevents the backflow of the support panel 24 material between the flexible printed circuit 50 and the channel guide 130.

With reference again to FIGS. 2, 4A and 4D, a substrate 66 is provided in the electronic assembly 12. In aspects, the substrate 66 is coupled to the second face 78 of the printed circuit board 60 and the substrate 66 is at least coextensive with the housing 62. In additional aspects, at least a portion of the substrate 66 extends past, or outward of, the side wall 104 of the housing 62. Further, the printed circuit board 60 is enclosed within the housing 62 and substrate 66, wherein the side walls 104 extend down around the side wall 80 of the printed circuit board 60. In aspects, the side walls 104 and the substrate 66 are adhered together with an adhesive or they are contiguous. In aspects, the substrate 66 is a film, formed from, e.g., poly(methyl methacrylate) (PMMA) or polyurea, polyurethane. In aspects, the film has a thickness in the range of 0.05 mm to 10 mm, including all values and ranges therein. When positioned in a trim panel assembly 22 the substrate 66 is mounted adjacent to the skin layer 30. Further, in aspects, the substrate is a black painted film.

Figure 6:
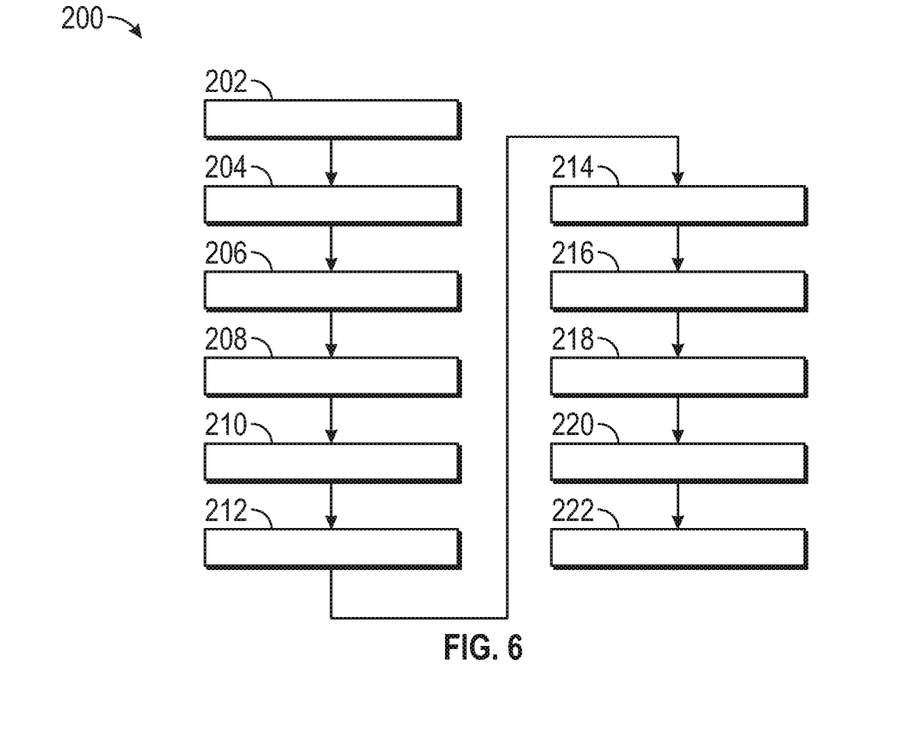
FIG. 6 is a flow chart of a method according to an exemplary embodiment.

A method of forming the electronic assembly 12 is illustrated in FIG. 6 and with further reference to FIGS. 2 through 4B. In aspects, the method 200 includes at block 202 affixing wires 52 to the distal end 134 of the flexible printed circuit 50. At block 204, the flexible printed circuit 50 is then connected at its proximal end 136 to the printed circuit board 60 by, e.g., soldering the flexible printed circuit 50 to contacts 98 on the printed circuit board 60. At block 206, the filler component 64 is then molded over a first portion 120 of the first face 76 of the printed circuit board 60 and electrical components 92 contained in the first portion 120 of the printed circuit board 60. The filler component 64 is molded over the proximal end 136 of the flexible printed circuit 50 and, in aspects, where the flexible printed circuit 50 is connected to the printed circuit board 60. The filler component 64 is molded over the printed circuit board 60 by processes such a form of injection molding known as over-molded onto the printed circuit board 60 or casting the filler component 64 onto the printed circuit board 60. At block 208 the reflector 68 may be affixed to the housing 62 and at block 210 the housing 62 is affixed to the printed circuit board 60 and in block 212 the flexible printed circuit 50 is arranged in the channel guide 130. However, it may be appreciated that these steps may be reversed and the housing 62 may be affixed to the printed circuit board 60 prior to affixing the reflector 68 to the housing 62. Further, in alternative aspects, the filler component 64 may be molded in between the housing 62 and the printed circuit board 60 after the housing 62 is affixed to the printed circuit board 60. At block 214, the substrate 66 is positioned adjacent to the printed circuit board 60 and, in aspects, is adhered to the second face 78 of the printed circuit board 60. Any time after block 202, such as at block 206 or at block 216, the protective covering 146 is molded over the connection between the wires 52 and the flexible printed circuit 50.

At block 218, the electronic assembly 12 is arranged in the support panel 24 to provide the trim panel assembly 22. In aspects, the support panel 24 is over-molded onto the electronic assembly 12 and specifically over-molded around the electronic assembly 12 housing 62. The flow of the support panel 24 material around the housing 62 and locating features 46 extending from the housing 62, in aspects, provides a contiguous interface between the housing 62 and the support panel 24 such that a bond may be formed between the support panel 24 and the housing 62. A cavity 38 is then defined in the support panel 24 by the housing 62. Further, receiving features 44 may be formed in the support panel 24 by the locating features 46 of the housing 62. Further, as noted above, the protective covering 146 provides a mold shut-off to prevent back flow of the support panel 24 material in between the flexible printed circuit 50 and the channel guide 130. At block 220, the skin layer 30 is arranged over the electronic assembly 12 and the support panel 24. In aspects, the skin layer 30 is over-molded onto the support panel 24 and over the electronic assembly 12 to create a continuous surface. The trim panel assembly 22 may then be mounted on a vehicle 10 in an appropriate location at block 222.

An electronic assembly including a flexible printed circuit for coupling the printed circuit board to the wires of the present disclosure offers several advantages. These include a relatively robust connection to the printed circuit board through soldering of the flexible printed circuit to the printed circuit board. These also include the elimination of a connector on the printed circuit board typically used to connect round wires. These also include providing a relatively more robust assembly process, reducing failures typically caused by plugging wires into a connector box on the printed circuit board. These yet also include the relative reduction in thickness in the flexible printed circuit at the printed circuit board connection as compared to using round wires. Use of the relatively thinner flexible printed circuit also provides room to accommodate a filler component, such as a low pressure molding resin, over the flexible printed circuit connection to the printed circuit board. These further include the flexibility in configuring the shape of the flexible printed circuit to accommodate routing the circuit in accordance with various configurations. These yet further include the ability to affix a single flexible printed circuit to one or more printed circuit boards to prepare for plastic over-molding.

The description of the present disclosure is merely exemplary in nature and variations that do not depart form the gist of the present disclosure are intended to be within the scope of the present disclosure. Such variations are not to be regarded as a departure from the spirit and scope of the present disclosure.

What is claimed is:

1. An electronic assembly, comprising:
a printed circuit board including a first face;
a flexible printed circuit connected to the first face of the printed circuit board;
a filler component arranged over a first portion of the first face of the printed circuit board;
a housing defining a cavity, wherein the filler component is arranged in the cavity;
a channel guide extending from the housing, wherein the flexible printed circuit sits in the channel guide; and
a substrate positioned adjacent to a second face of the printed circuit board, wherein the second face opposes the first face.

2. The electronic assembly of claim 1, wherein the first face of the printed circuit board includes a plurality of electrical components and the filler component encapsulates at least a portion of the electrical components.

3. The electronic assembly of claim 1, wherein the printed circuit board includes a plurality of contacts and the flexible printed circuit is soldered to at least a portion of the plurality of contacts.

4. The electronic assembly of claim 1, wherein in the flexible printed circuit defines a proximal end and the proximal end is connected to the printed circuit board and the filler component encapsulates the proximal end.

5. The electronic assembly of claim 1, wherein the second portion of the printed circuit board includes a plurality of openings and a light emitter associated with each of the plurality of openings.

6. The electronic assembly of claim 5, wherein the housing defines an exterior opposing the cavity and a reflector is mounted to the exterior of the housing covering the second portion of the printed circuit board.

7. The electronic assembly of claim 1, wherein the flexible printed circuit includes a distal end and the electronic assembly further comprises a plurality of wires in contact with the distal end of the flexible printed circuit.

8. The electronic assembly of claim 7, wherein the plurality of wires are mechanically retained against the flexible printed circuit.

9. The electronic assembly of claim 7, further comprising a protective covering encasing the distal end of the flexible printed circuit and the plurality of wires.

10. The electronic assembly of claim 9, wherein the protective covering is formed from a low pressure molding resin and sits in the channel guide.

11. The electronic assembly of claim 1, wherein the filler component is formed from a low-pressure molding resin.

12. The electronic assembly of claim 1, wherein the substrate is connected to the second face of the printed circuit board.

13. The electronic assembly of claim 1, wherein the substrate is connected to the housing.

14. A trim panel assembly, comprising:
a support panel, the support panel including an exterior surface and a cavity defined in the exterior surface;
an electronic assembly located in the cavity, the electronic assembly including
a printed circuit board including a first face and a second face,
a flexible printed circuit coupled to the first face of the printed circuit board,
a filler component arranged over a first portion of the first face of the printed circuit board,
a housing including a cavity, wherein the filler component is arranged in the cavity,
a channel guide extending from the housing, wherein the flexible printed circuit sits in the channel guide, and
a substrate positioned adjacent to the second face of the printed circuit board; and
a skin layer connected to the support panel, wherein the electronic assembly is positioned between the support panel and the skin layer and the substrate is adjacent to the skin layer.

15. The trim panel assembly of claim 14, wherein the flexible printed circuit includes a distal end and the electronic assembly further comprises a plurality of wires connected to the distal end of the flexible printed circuit at a connection.

16. The trim panel assembly of claim 15, further comprising a protective covering encasing the connection between the flexible printed circuit and the plurality of wires, wherein the protective covering is at least partially received in the channel guide.

17. The trim panel assembly of claim 16, wherein the protective covering is formed from a low pressure molding resin.

* * * * *